(12) United States Patent
Kawasaki et al.

(10) Patent No.: US 11,492,724 B2
(45) Date of Patent: Nov. 8, 2022

(54) DIE FOR EFG-BASED SINGLE CRYSTAL GROWTH, EFG-BASED SINGLE CRYSTAL GROWTH METHOD, AND EFG SINGLE CRYSTAL

(71) Applicant: TDK CORPORATION, Tokyo (JP)

(72) Inventors: Katsumi Kawasaki, Tokyo (JP); Jun Hirabayashi, Tokyo (JP); Minoru Fujita, Tokyo (JP); Daisuke Inokuchi, Tokyo (JP); Jun Arima, Tokyo (JP); Makio Kondo, Tokyo (JP)

(73) Assignee: TDK CORPORATION, Tokyo (JP)

( * ) Notice: Subject to any disclaimer, the term of this patent is extended or adjusted under 35 U.S.C. 154(b) by 93 days.

(21) Appl. No.: 16/982,280

(22) PCT Filed: Jan. 25, 2019

(86) PCT No.: PCT/JP2019/002551
§ 371 (c)(1),
(2) Date: Sep. 18, 2020

(87) PCT Pub. No.: WO2019/181197
PCT Pub. Date: Sep. 26, 2019

(65) Prior Publication Data
US 2021/0017668 A1    Jan. 21, 2021

(30) Foreign Application Priority Data

Mar. 23, 2018 (JP) .............................. JP2018-056165

(51) Int. Cl.
*C30B 15/34* (2006.01)
*C30B 29/16* (2006.01)

(52) U.S. Cl.
CPC .............. *C30B 15/34* (2013.01); *C30B 29/16* (2013.01)

(58) Field of Classification Search
CPC ... C30B 15/34; C30B 29/16; Y10T 117/1036; Y10T 117/1044
See application file for complete search history.

(56) References Cited

U.S. PATENT DOCUMENTS

| | | | | |
|---|---|---|---|---|
| 5,458,083 | A * | 10/1995 | Fukuda | ................... C30B 15/34 117/16 |
| 2015/0125699 | A1 * | 5/2015 | Aida | ....................... C30B 15/20 428/402 |

(Continued)

FOREIGN PATENT DOCUMENTS

| | | |
|---|---|---|
| GB | 2 139 917 A | 11/1984 |
| JP | S53-040593 B2 | 10/1978 |

(Continued)

OTHER PUBLICATIONS

Sep. 29, 2020 International Preliminary Report on Patentability issued in International Patent Application No. PCT/JP2019/002551.

(Continued)

*Primary Examiner* — Robert M Kunemund
(74) *Attorney, Agent, or Firm* — Oliff PLC (57) ABSTRACT

A die for EFG-based single crystal growth includes a lower surface to be immersed into a raw material melt with an impurity added, a rectangular upper surface facing a seed crystal and having a long side and a short side, and a plurality of slit sections extending from the lower surface to the upper surface and causing the raw material melt to ascend from the lower surface to the upper surface. Respective longitudinal directions of openings of the plurality of slit sections on the upper surface are parallel to one another and non-parallel to the long side of the upper surface.

7 Claims, 9 Drawing Sheets

(56) References Cited

U.S. PATENT DOCUMENTS

2016/0122899 A1* 5/2016 Koshi .................... C30B 15/34
                                                          117/26
2017/0152610 A1* 6/2017 Watanabe ............... C30B 15/34

FOREIGN PATENT DOCUMENTS

| JP | 2012-229134 A | 11/2012 |
|----|---------------|---------|
| JP | 2013-124216 A | 6/2013 |
| JP | 5891028 B2 | 3/2016 |
| JP | 2017-193472 A | 10/2017 |
| TW | 201625823 A | 7/2016 |
| WO | 2016/043176 A1 | 3/2016 |

OTHER PUBLICATIONS

Feb. 26, 2019 International Search Report issued in International PCT/JP2019/002551.

Shinya Watanabe et al. "Lateral Dopant Segregation of β-Ga2O3 Single Crystals By Edge-Defined Film-Fed Growth (EFG) Method". 63rd Japan Society of Applied Physics Spring Meeting, Presentation Proceedings (2016, Institute of Technology, Ookayama Campus), 2016, pp. 12-013.

Dec. 9, 2021 Search Report issued in European Patent Application No. EP 19 77 1196.

Miyazawa et al., "Shaped Melt Lowering (SML): A Novel Growth Technique Permitting keff=1," Journal of Crystal Growth, Elsevier, Amsterdam, NL, vol. 60. No. 1, Dec. 1, 1982, pp. 331-337.

* cited by examiner

| REGION | DIMENSION OR QUANTITY |
|---|---|
| LONG SIDE OF UPPER SURFACE OF DIE | 59.8 mm |
| SHORT SIDE OF UPPER SURFACE OF DIE | 20.0 mm |
| LONGITUDINAL DIRECTION OF OPENING OF SLIT SECTION | 18.0 mm |
| TRAVERSE DIRECTION OF OPENING OF SLIT SECTION | 0.2 mm |
| INTERVAL BETWEEN CENTER LINES OF OPENINGS OF NEIGHBORING SLIT SECTIONS | 1.2 mm |
| INTERVAL BETWEEN OPENINGS OF NEIGHBORING SLIT SECTIONS | 1.0 mm |
| DISTANCE OF OPENING OF SLIT SECTION FROM OUTER EDGE OF UPPER SURFACE OF DIE | 1.0 mm |
| TOTAL NUMBER OF SLIT SECTIONS | 49 SLIT SECTIONS |

Fig.6

| REGION | DIMENSION OR QUANTITY |
|---|---|
| LONG SIDE OF UPPER SURFACE OF DIE | 60.0 mm |
| SHORT SIDE OF UPPER SURFACE OF DIE | 19.2 mm |
| LONGITUDINAL DIRECTION OF OPENING OF SLIT SECTION | 55.2 mm |
| TRAVERSE DIRECTION OF OPENING OF SLIT SECTION | 0.4 mm |
| INTERVAL BETWEEN CENTER LINES OF OPENINGS OF NEIGHBORING SLIT SECTIONS | 2.8 mm |
| INTERVAL BETWEEN OPENINGS OF NEIGHBORING SLIT SECTIONS | 2.4 mm |
| DISTANCE OF OPENING OF SLIT SECTION FROM OUTER EDGE OF UPPER SURFACE OF DIE | 2.4 mm |
| TOTAL NUMBER OF SLIT SECTIONS | 6 SLIT SECTIONS |

DIE FOR EFG-BASED SINGLE CRYSTAL GROWTH, EFG-BASED SINGLE CRYSTAL GROWTH METHOD, AND EFG SINGLE CRYSTAL

TECHNICAL FIELD

The present invention relates to a die for EFG-based single crystal growth, an EFG-based single crystal growth method and an EFG-based single crystal.

BACKGROUND ART

In growing a single crystal using an EFG (Edge-defined Film-fed Growth) method, a shape of a cross section orthogonal to a growth direction of a single crystal to be grown is defined by a shape of an upper surface of a die for single crystal growth. Single crystals are often used after being processed into a thin plate shape as a substrate. When a single crystal having a rectangular cross section is grown using a die for single crystal growth having a rectangular upper surface, it is possible to greatly suppress processing loss in processing the grown single crystal into a substrate. For this reason, the EFG method is used to grow various single crystals.

For example, Patent Literature 1 proposes a method for growing a thick plate-like single crystal having a thickness of 11 mm or more, slicing the single crystal and thereby manufacturing a plurality of thin plate-like substrates from the single thick plate-like single crystal in order to reduce processing loss. The die for single crystal growth described in Patent Literature 1 is provided with a plurality of slits, in which respective longitudinal directions of openings of the slits on an upper surface of the die are in parallel with a long side of the rectangular upper surface of the die.

For the purpose of imparting specific characteristics such as semiconductor characteristics and fluorescence properties to the substrate, an impurity may be added to a single crystal. It is preferable to make distribution of the added impurity uniform within the single crystal in order to make the imparted characteristic effect uniform within the substrate. However, as described in Non Patent Literature 1, it is known that an impurity concentration of a grown single crystal fluctuates according to a distance from the slits. Thus, as in the case of the technique described in above Patent Literature 1, a single crystal may be grown using such a die that a plurality of slits are provided on an upper surface and a distance between the neighboring slits is shortened.

CITATION LIST

Patent Literature

Patent Literature 1: Japanese Patent No. 5891028

Non Patent Literature

Non Patent Literature 1: Watanabe and five others, "Dopant Segregation of $\beta$-$Ga_2O_3$ Single Crystal using EFG Method," Proceedings of the 63rd Spring Meeting of the Japan Society of Applied Physics (2016 Tokyo Institute of Technology, Ookayama Campus), the Japan Society of Applied Physics, 2016, p. 12-013

SUMMARY OF INVENTION

Technical Problem

However, the uniformity of the impurity concentration of the single crystal grown using the technique described in Patent Literature 1 above is insufficient, improvement of which is needed.

It is therefore an object of the present invention to provide a die for EFG-based single crystal growth, an EFG-based single crystal growth method and an EFG-based single crystal capable of improving uniformity of an impurity concentration of a grown single crystal.

Solution to Problem

A first aspect of the present invention is a die for EFG-based single crystal growth comprising a lower surface to be immersed into a raw material melt with an impurity added, a rectangular upper surface facing a seed crystal and having a long side and a short side shorter than the long side, and a plurality of slit sections extending from the lower surface to the upper surface and causing the raw material melt to ascend from the lower surface to the upper surface. Respective longitudinal directions of openings of the plurality of slit sections on the upper surface are parallel to one another and non-parallel to the long side of the upper surface.

According to this configuration, the die for EFG-based single crystal growth comprises a lower surface to be immersed into a raw material melt with an impurity added, a rectangular upper surface facing a seed crystal and having a long side and a short side shorter than the long side, and a plurality of slit sections extending from the lower surface to the upper surface and causing the raw material melt to ascend from the lower surface to the upper surface. Respective longitudinal directions of openings of the plurality of slit sections on the upper surface are parallel to one another and non-parallel to the long side of the upper surface. Therefore, if total areas of the openings of slit sections are same, an interval between the neighboring slit sections is shorter than the interval when the respective longitudinal directions of openings of the slit sections on the upper surface are parallel to the long side of the upper surface, and impurity segregation is less likely to occur between the slit sections, and so it is possible to improve uniformity of an impurity concentration of the grown single crystal.

In this case, the respective longitudinal directions of the openings of the plurality of slit sections on the upper surface may be parallel to the short side of the upper surface.

According to this configuration, since the respective longitudinal directions of the openings of the plurality of slit sections on the upper surface are parallel to the short side of the upper surface, the interval between the neighboring slit sections is shorter than the interval when the respective longitudinal directions of the openings of the slit sections on the upper surface are parallel to the long side of the upper surface, and it is possible to improve uniformity of an impurity concentration of the grown single crystal.

The distance of the opening of the slit section on the upper surface in which the opening on the upper surface is most proximate to the outer edge of the upper surface, among the plurality of slit sections, from the outer edge of the upper surface may be 2 mm or less.

According to this configuration, since the distance of the opening of the slit section on the upper surface in which the opening on the upper surface is most proximate to the outer edge of the upper surface among the plurality of slit sections from the outer edge is 2 mm or less, it is possible to expand the region where the impurity concentration of the grown single crystal is uniformized.

The interval between center lines in the longitudinal direction of the openings of the neighboring slit sections on the upper surface may be 2 mm or less.

According to this configuration, since the interval between center lines in the longitudinal direction of the openings of the neighboring slit sections on the upper surface is 2 mm or less, it is possible to further improve uniformity of an impurity concentration of the grown single crystal.

The respective lengths in the traverse direction of the openings of the plurality of slit sections on the upper surface may be 2 mm or less.

According to this configuration, since the respective lengths in the traverse direction of the openings of the plurality of slit sections on the upper surface are 2 mm or less, it is possible to increase the height by which the slit sections cause the raw material melt to ascend from the lower surface to the upper surface.

On the other hand, a second aspect of the present invention is an EFG-based single crystal growth method using the above die for EFG-based single crystal growth of the present invention.

According to this configuration, it is possible to grow a single crystal with impurity concentration uniformity improved using the EFG method.

A third aspect of the present invention is an EFG-based single crystal grown using the above EFG-based single crystal growth method of the present invention, in which an impurity concentration fluctuation coefficient is 30% or less in a region excluding a distance range of 1 mm from an outer edge of a cross section orthogonal to a growth direction of the single crystal.

According to this configuration, it is possible to provide a single crystal with improved impurity concentration uniformity and with more uniform characteristics.

Advantageous Effects of Invention

According to the first aspect, the second aspect and the third aspect of the present invention, it is possible to improve impurity concentration uniformity of a grown single crystal.

DESCRIPTION OF EMBODIMENTS

Figure 1:
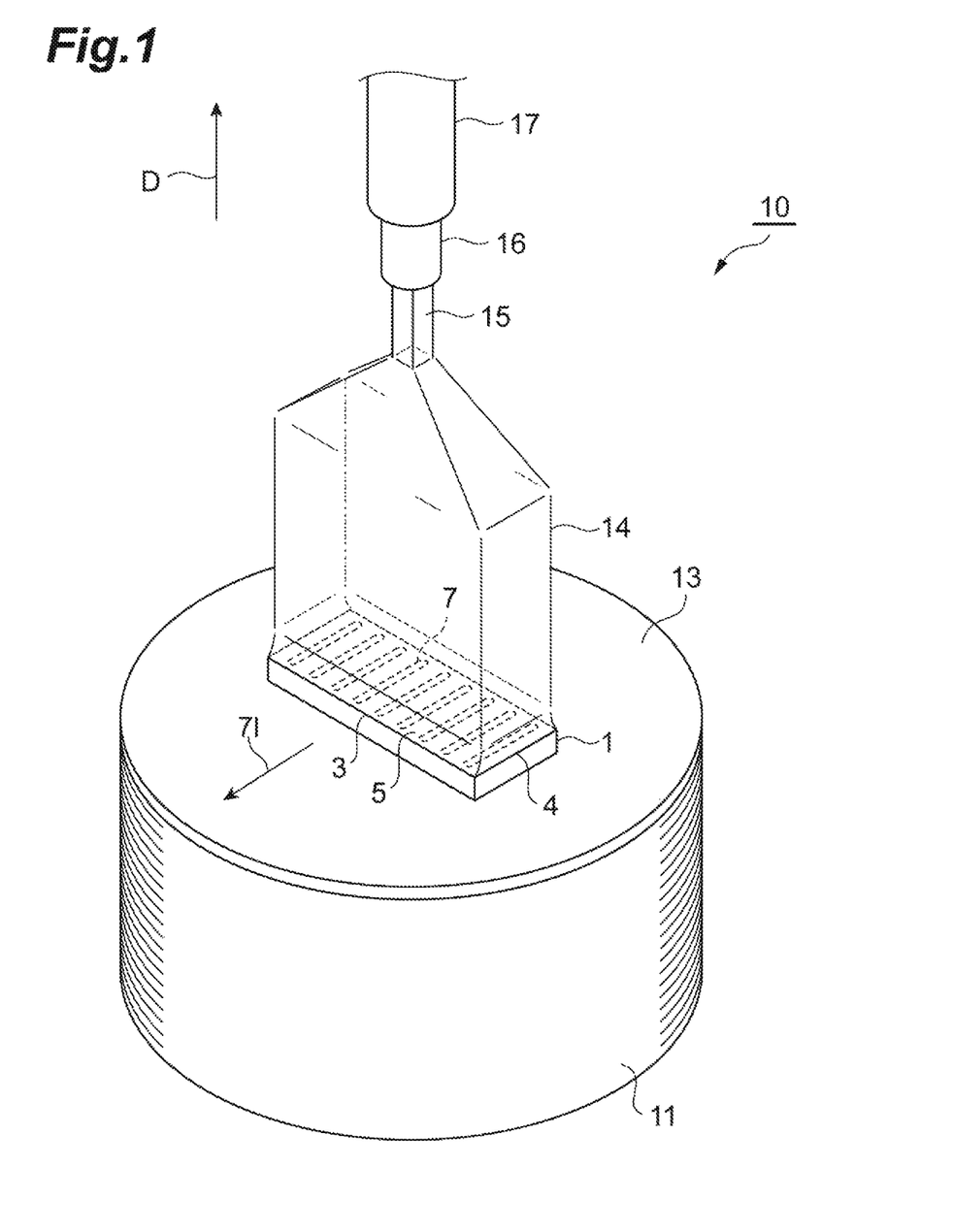
FIG. 1 is a perspective view illustrating an EFG-based crucible, a die for EFG-based single crystal growth and an EFG-based single crystal according to an embodiment.
Figure 2:
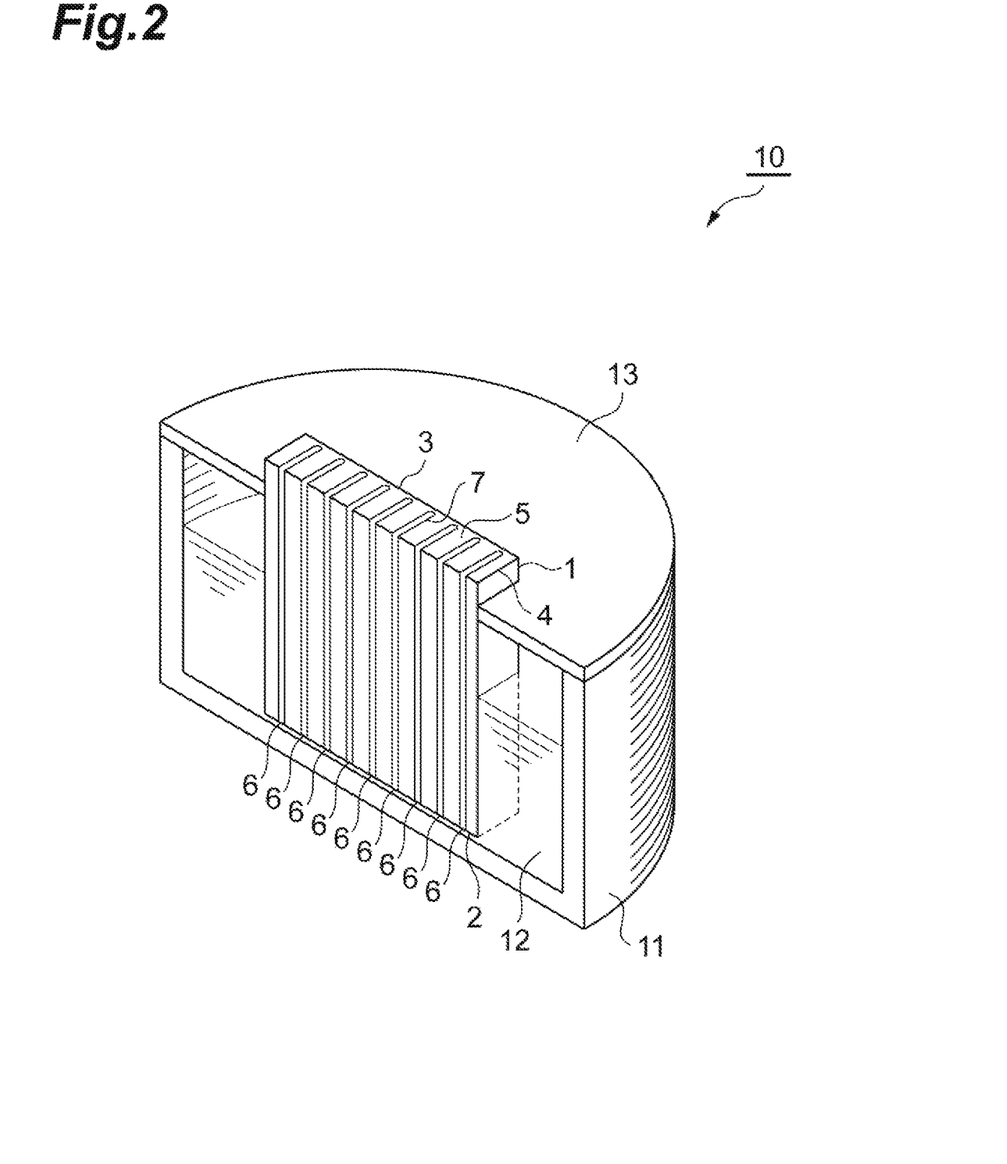
FIG. 2 is a longitudinal cross-sectional view of the EFG-based crucible and the die for EFG-based single crystal growth in FIG. 1.

Hereinafter, an embodiment of the present invention will be described in detail with reference to the accompanying drawings. A die for EFG-based single crystal growth and an EFG-based single crystal growth method according to the present embodiment are intended to grow, for example, a β-$Ga_2O_3$ single crystal using an EFG method. As shown in FIG. 1 and FIG. 2, an EFG-based single crystal manufacturing apparatus 10 is provided with a crucible 11 accommodating a raw material melt 12 based on $Ga_2O_3$ or the like, a die 1 for EFG-based single crystal growth installed in the crucible 11, a lid 13 covering an upper surface of the crucible 11 except an upper surface 5 of the die 1, a seed crystal holder 16 holding a seed crystal 15 based on $Ga_2O_3$ or the like and a shaft 17 liftably supporting the seed crystal holder 16.

The crucible 11 is heated by heating means (not shown) and heated up to, for example, 1800° C. or higher exceeding a melting point of β-$Ga_2O_3$. A solid raw material based on $Ga_2O_3$ or the like having an additive concentration of 0.016 mol % of an additive such as Sn accommodated in the crucible 11 is melted in a heating process and converts to the raw material melt 12 based on $Ga_2O_3$ or the like. The crucible 11 and the die 1 for EFG-based single crystal growth are made of iridium-based metal materials having heat resistance capable of accommodating the raw material melt 12 based on $Ga_2O_3$ or the like. The lid 13 prevents the raw material melt 12 based on $Ga_2O_3$ or the like from evaporating from the crucible 11 and further prevents a vapor of the raw material melt 12 based on $Ga_2O_3$ or the like from adhering to the seed crystal 15 based on $Ga_2O_3$ or the like.

The die 1 for EFG-based single crystal growth is provided with a lower surface 2 to be immersed into the raw material melt 12 based on $Ga_2O_3$ or the like with an impurity such as Sn added, the rectangular upper surface 5 facing the seed crystal 15 based on $Ga_2O_3$ or the like and having a long side 3 and a short side 4 shorter than the long side 3, and a plurality of slit sections 6 extending from the lower surface 2 to the upper surface 5 and causing the raw material melt 12 to ascend from the lower surface 2 to the upper surface 5. Note that examples of the rectangular upper surface 5 include a surface in which corners formed of the long side 3 and the short side 4 of the upper surface 5 form angles other than exact 90° and a surface in which corners are rounded.

Figure 3:
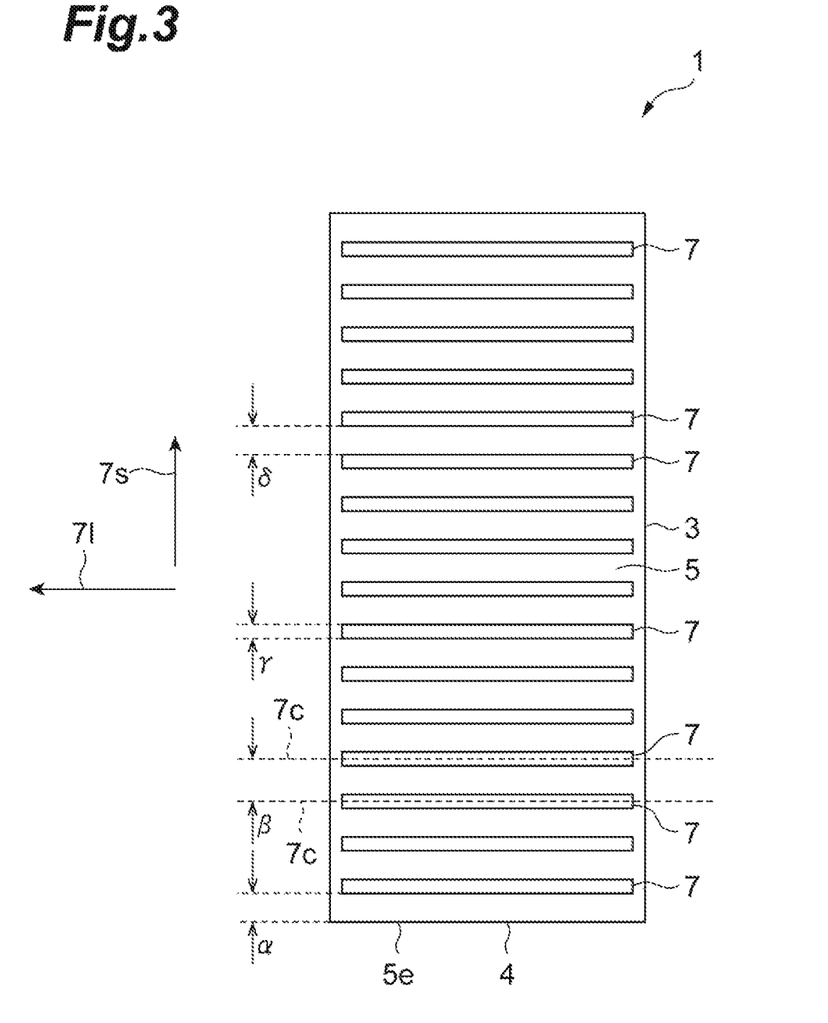
FIG. 3 is a plan view of the die for EFG-based single crystal growth according to the embodiment.

As shown in FIG. 1, FIG. 2 and FIG. 3, openings 7 of the plurality of slit sections 6 on the upper surface 5 each have a rectangular shape, and a longitudinal direction 7l and a traverse direction 7s. The respective longitudinal directions 7l of the openings 7 of the plurality of slit sections 6 on the upper surface 5 are parallel to one another and non-parallel to the long side 3 of the upper surface 5. More specifically, the respective longitudinal directions 7l of the openings 7 of the plurality of slit sections 6 on the upper surface 5 are parallel to the short side 4 of the upper surface 5. Note that examples of the rectangular openings 7 also include a case where corners formed of the longitudinal direction 7l and the traverse direction 7s of the opening 7 form an angle other than exact 90° and a case where the corners are rounded.

As shown in FIG. 3, a distance α of the opening 7 of the slit section 6 on the upper surface 5 in which the opening 7 on the upper surface 5 is most proximate to an outer edge 5e of the upper surface 5 among the plurality of slit sections 6 from the outer edge 5e of the upper surface 5 is 2 mm or less. Intervals β between center lines 7c in the longitudinal direction 71 of the openings 7 of the neighboring slit sections 6 on the upper surface 5 are equal and are 2 mm or less. Respective lengths γ in the traverse direction 7s of the openings 7 of the plurality of slit sections 6 on the upper surface 5 is 2 mm or less. Respective intervals δ between the openings 7 of the neighboring slit sections 6 on the upper surface 5 are equal and are 2 mm or less. Note that the interval β and the interval δ between the openings 7 of the slit sections 6 need not always be equal.

Hereinafter, an EFG-based single crystal growth method using the die 1 for EFG-based single crystal growth of the present embodiment will be described. As shown in FIG. 2, the die 1 for single crystal growth is installed in the crucible 11 so that the lower surface 2 of the die 1 is accommodated in the crucible 11 and is immersed into the raw material melt 12 based on $Ga_2O_3$ or the like with an impurity such as Sn added. Due to a capillary phenomenon, the raw material melt 12 based on $Ga_2O_3$ or the like ascends in the slit sections 6 and reaches the upper surface 5 of the die 1.

An output of heating means (not shown) is adjusted so that the temperature of the upper surface 5 of the die 1 becomes a temperature suitable for growth. As shown in FIG. 1, the shaft 17 is caused to descend and the seed crystal 15 based on $Ga_2O_3$ or the like held by the seed crystal holder 16 comes into contact with the raw material melt 12 based on $Ga_2O_3$ or the like, which has reached the upper surface 5 of the die 1. The shaft 17 is caused to ascend and raise the seed crystal 15 based on $Ga_2O_3$ or the like in contact with the raw material melt 12 based on $Ga_2O_3$ or the like, thus causing a single crystal 14 based on $Ga_2O_3$ or the like to grow in a growth direction D from the upper surface 5 of the die 1.

According to the EFG-based single crystal growth method using the die 1 for EFG-based single crystal growth of the above present embodiment, the EFG-based single crystal 14 is grown, the single crystal 14 having, for example, an impurity concentration fluctuation coefficient of 30% or less in the region excluding a distance range of 1 mm from an outer edge of a cross section orthogonal to the growth direction D of the single crystal 14.

According to the present embodiment, the die 1 for EFG-based single crystal growth comprises the lower surface 2 to be immersed into the raw material melt 12 with an impurity added, the rectangular upper surface 5 facing the seed crystal 15 and having the long side 3 and the short side 4 shorter than the long side 3, and the plurality of slit sections 6 extending from the lower surface 2 to the upper surface 5 and causing the raw material melt 12 to ascend from the lower surface 2 to the upper surface 5. The respective longitudinal directions 71 of openings 7 of the plurality of slit sections 6 on the upper surface 5 are parallel to one another and non-parallel to the long side 3 of the upper surface 5. Therefore, if total areas of the openings 7 of slit sections 6 are same, the interval δ between the openings 7 of the neighboring slit sections 6 is shorter than the interval when the respective longitudinal directions 71 of the openings 7 of the slit sections 6 on the upper surface 5 are parallel to the long side 3 of the upper surface 5, and impurity segregation is less likely to occur between the respective slit sections 6, and so it is possible to improve uniformity of an impurity concentration of the grown single crystal 14.

According to the present embodiment, since the respective longitudinal directions 71 of the openings 7 of the plurality of slit sections 6 on the upper surface 5 are parallel to the short side 4 of the upper surface 5, the respective intervals δ between the openings 7 of the neighboring slit sections 6 are shorter than the interval when the respective longitudinal directions 71 of the openings 7 of the slit sections 6 on the upper surface 5 are parallel to the long side 3 of the upper surface 5, and it is thereby possible to improve uniformity of an impurity concentration of the grown single crystal 14. Furthermore, since the length of the longitudinal direction 71 of the opening 7 of the slit section 6 on the upper surface 5 is shorter than the length when the respective longitudinal directions 71 of the openings 7 of the slit sections 6 on the upper surface 5 are parallel to the long side 3 of the upper surface 5, the die 1 is less likely to deform and durability of the die 1 can be improved.

According to the present embodiment, the distance α of the opening 7 of the slit section 6 on the upper surface 5 in which the opening 7 on the upper surface 5 is most proximate to the outer edge 5e of the upper surface 5 among the plurality of slit sections 6 from the outer edge 5e is 2 mm or less, and it is thereby possible to expand the region where the impurity concentration of the grown single crystal 14 is made uniform.

As described, for example, in paragraph (0006) of Patent Literature 1, according to the prior art in which the respective longitudinal directions of the openings of the plurality of slits on the upper surface of the die are parallel to the long side of the rectangular upper surface of the die, a warp is produced when the thickness of the plate member constituting the die is 1 mm or less, and accurate manufacturing of the die requires a plate member having a thickness of 2.4 mm or more. That is, according to the prior art, the plate member constituting a widest side face of the die extending over a long distance in the direction parallel to the long side of the upper surface of the die is supported only at two locations, at both ends on the short side of the upper surface of the die, and therefore the mechanical strength of the die is low and the thickness of the plate member needs to be increased. Therefore, it is difficult for the prior art to set the distance α to 2 mm or less.

Figure 9:
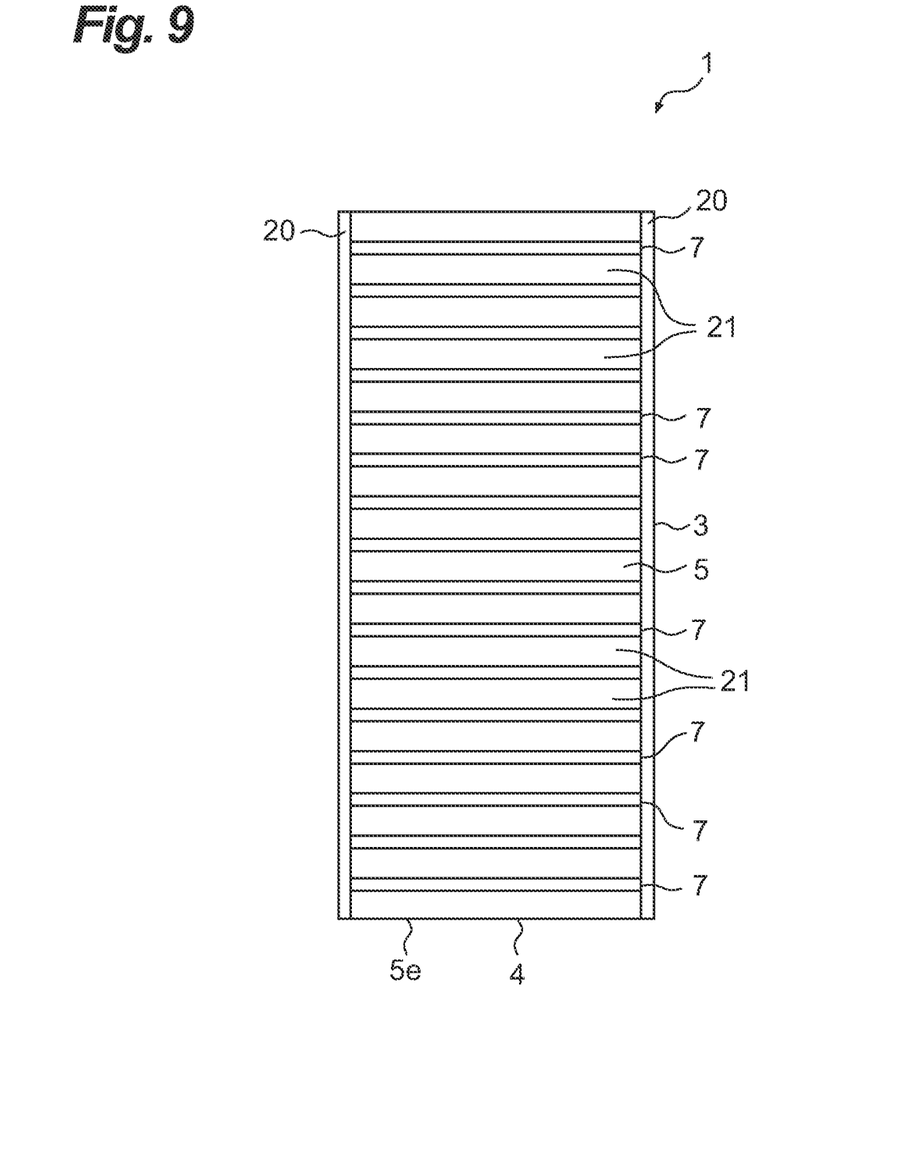
FIG. 9 is another plan view of the die for EFG-based single crystal growth of FIGS. 1-3.

On the other hand, according to the present embodiment, as shown by FIG. 9, the plate members 20 constituting the widest side face of the die 1 extending over a long distance in the direction parallel to the long side 3 of the upper surface 5 of the die 1 are also supported by the plate members 21 partitioning the respective slit sections 6 in addition to the two locations, at both ends on the short side 4 of the die 1. That is, in the present embodiment, the plate members 20 constituting the widest side face of the die 1 are supported at many supporting points and the supporting points are distributed over the entire die 1, and so the mechanical strength of the entire die 1 improves and the die 1 can be manufactured accurately even using thin plate members.

According to the present embodiment, since the interval β between the center lines 7c in the longitudinal direction 71 of the openings 7 of the neighboring slit sections 6 on the upper surface 5 is 2 mm or less, it is possible to further improve impurity concentration uniformity of the grown single crystal 14.

Regarding the plate members partitioning the respective slit sections, according to the prior art described in Patent Literature 1, the plate members partitioning the respective slit sections are supported only at two locations, at both ends on the short side of the upper surface of the die and extend in a direction parallel to the long side of the upper surface of the die over a long distance, and so an influence when a warp is produced in the plate members partitioning the respective slit sections is considerably large and the thickness of the plate members needs to be increased to prevent warpage. Therefore, it is difficult for the prior art to set the interval β to 2 mm or less.

On the other hand, according to the present embodiment, the distance between the two locations at both ends of the plate members at which the plate members partitioning the respective slit sections 6 are supported is the distance in a direction parallel to the short side 4, which is shorter than the distance in the direction parallel to the long side 3 of the upper surface 5 of the conventional die 1, and so even when a warp of the same radius of curvature is produced, the influence of the warp is minimal and it is possible to reduce the thickness of the plate members partitioning the respective slit sections 6.

According to the present embodiment, the respective lengths γ in the traverse direction 7s of the openings 7 of the plurality of slit sections 6 on the upper surface 5 are 2 mm or less, and so it is possible to increase the height by which the slit sections 6 cause the raw material melt 12 to ascend from the lower surface 2 to the upper surface 5.

According to the present embodiment, it is possible to grow the single crystal 14 in which impurity concentration uniformity is improved using the EFG method. Furthermore, according to the present embodiment, it is possible to provide the single crystal 14 in which impurity concentration uniformity is improved and characteristics are made more uniform.

Although the embodiment of the present invention has been described so far, the present invention is not limited to the above embodiment but can be implemented in various modes. For example, the shape and arrangement of the openings 7 of the plurality of slit sections 6 on the upper surface 5 can be changed as appropriate.

Example

Figure 5:
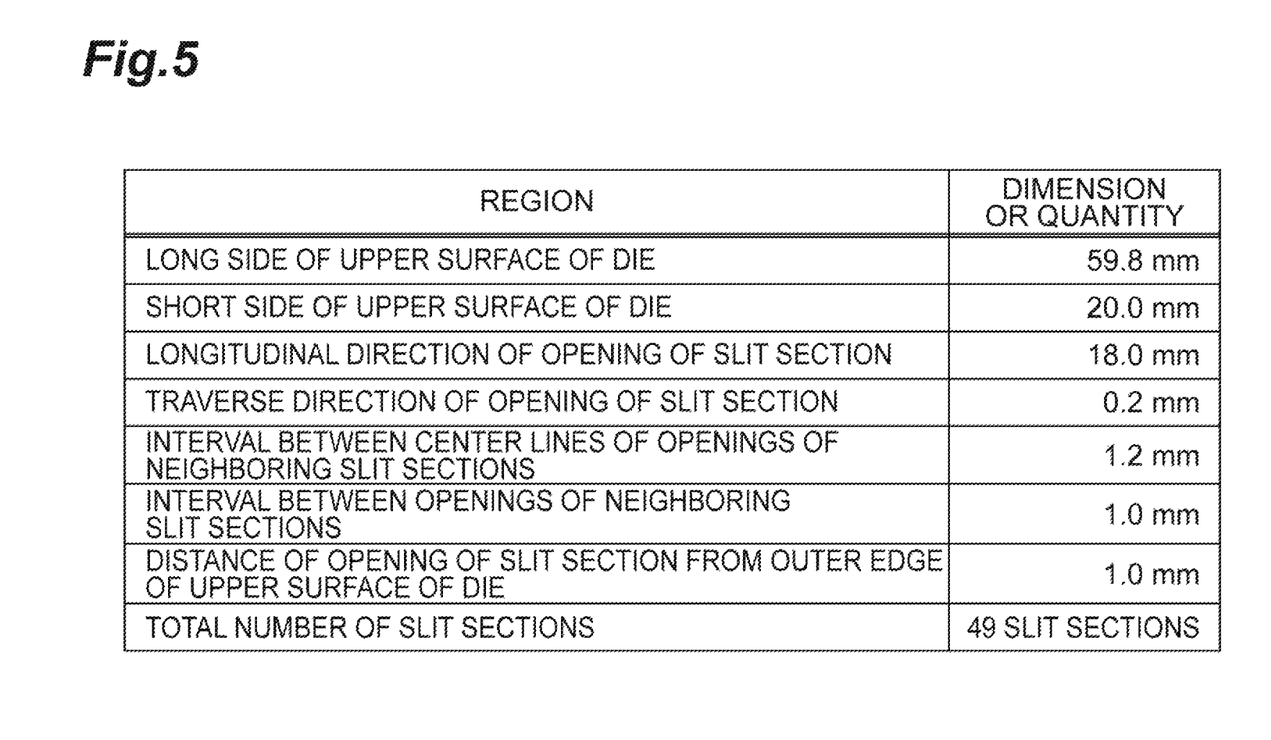
FIG. 5 is a table illustrating specifications of the die for EFG-based single crystal growth according to an example.

The $Ga_2O_3$-based single crystal 14 with Sn added as an impurity was grown using the aforementioned EFG-based single crystal manufacturing apparatus 10 and die 1 for EFG-based single crystal growth. Dimensions or quantities of the respective regions of the die 1 are as shown in FIG. 5. Portions of the $Ga_2O_3$-based raw material melt 12 caused to ascend through the plurality of slit sections 6 formed in the die 1 for single crystal growth were united and spread over the upper surface 5 of the die 1, and a thick plate-like $Ga_2O_3$-based single crystal 14 having a cross-sectional shape of a straight barrel portion of approximately 57 mm in width, approximately 18 mm in thickness and approximately 112 mm in length was grown.

The straight barrel portion was cut out from the grown single crystal 14, divided in two at a cross section intersecting in a length direction (growth direction D), each of the two single crystal blocks having a thickness of approximately 18 mm obtained was cut into 18 flat plates so that the cutting surfaces cut by a multi-saw were parallel to the main surface of the crystal. After each of the two single crystal blocks was cut into the 18 flat plates, both surfaces of the respective flat plates were then polished and 36 single crystal substrates having a thickness of 0.4 mm were manufactured from one single crystal 14.

Figure 7:
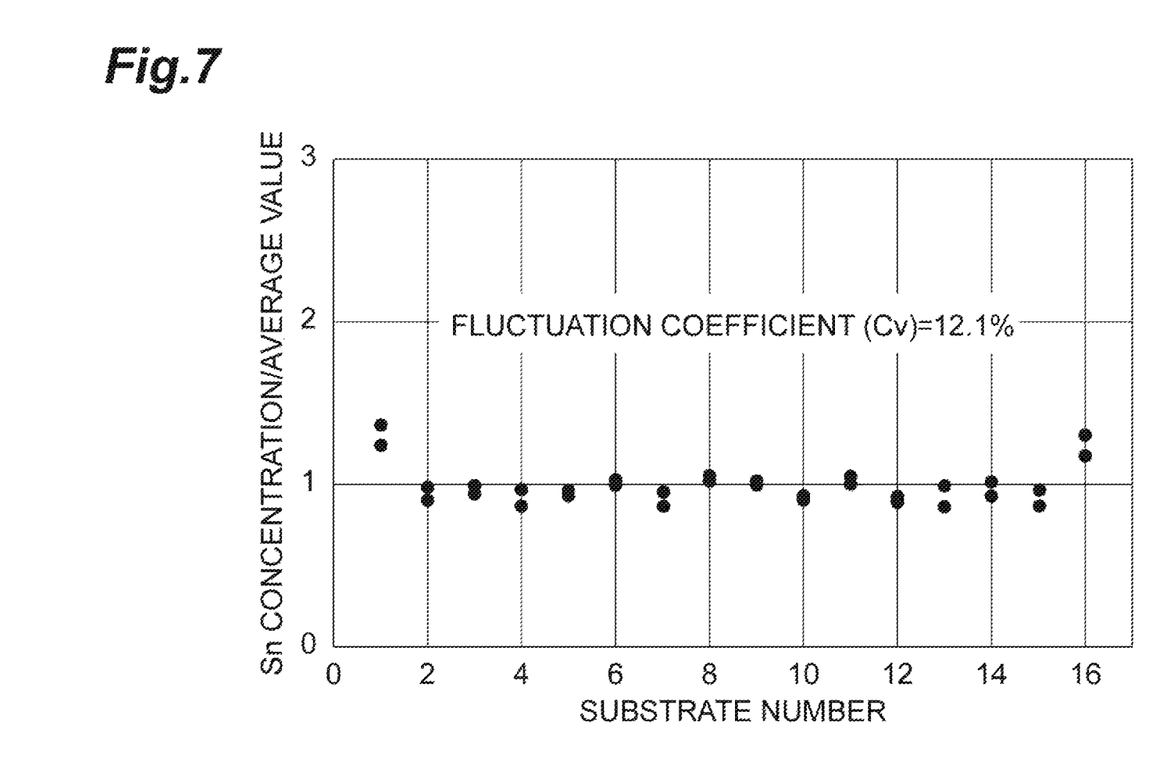
FIG. 7 is a graph illustrating an impurity concentration of the EFG-based single crystal according to the example.

Sn concentrations of 32 single crystal substrates obtained by excluding 4 single crystal substrates located on an outermost side of the single crystal 14 during single crystal growth and having low crystallinity from the 36 single crystal substrates obtained were measured using SIMS (Secondary Ion Mass Spectrometry). That is, concentrations of Sn, which was an impurity, in the region obtained by excluding a distance range of 1 mm from the outer edge of a cross section orthogonal to the growth direction D of the single crystal 14 were measured. The measurement results are shown in FIG. 7. The abscissa of a graph in FIG. 7 represents order of the single crystal substrates in the thickness direction obtained by cutting the $Ga_2O_3$-based single crystal 14 grown into a thick plate shape in parallel with the main surface of the crystal. The ordinate of the graph in FIG. 7 represents a value obtained by dividing the respective measured values of Sn concentrations of the 32 single crystal substrates by an average value of Sn concentrations of the 32 substrates. A fluctuation coefficient (Cv) of the 32 single crystal substrates, that is, a value obtained by dividing a standard deviation of Sn concentrations by the average value was 12.1%, which is equal to or less than 30%. That is, it is seen that the impurity concentration of the single crystal 14 grown by the die 1 in the example exhibits a high level of uniformity.

Although growth of the above single crystal 14 was repeated 12 times or more, no significant change in shape in the die 1 for single crystal growth was observed. That is, it is seen that the die 1 for single crystal growth hardly deforms and has excellent durability as well.

Comparative Example

Figure 4:
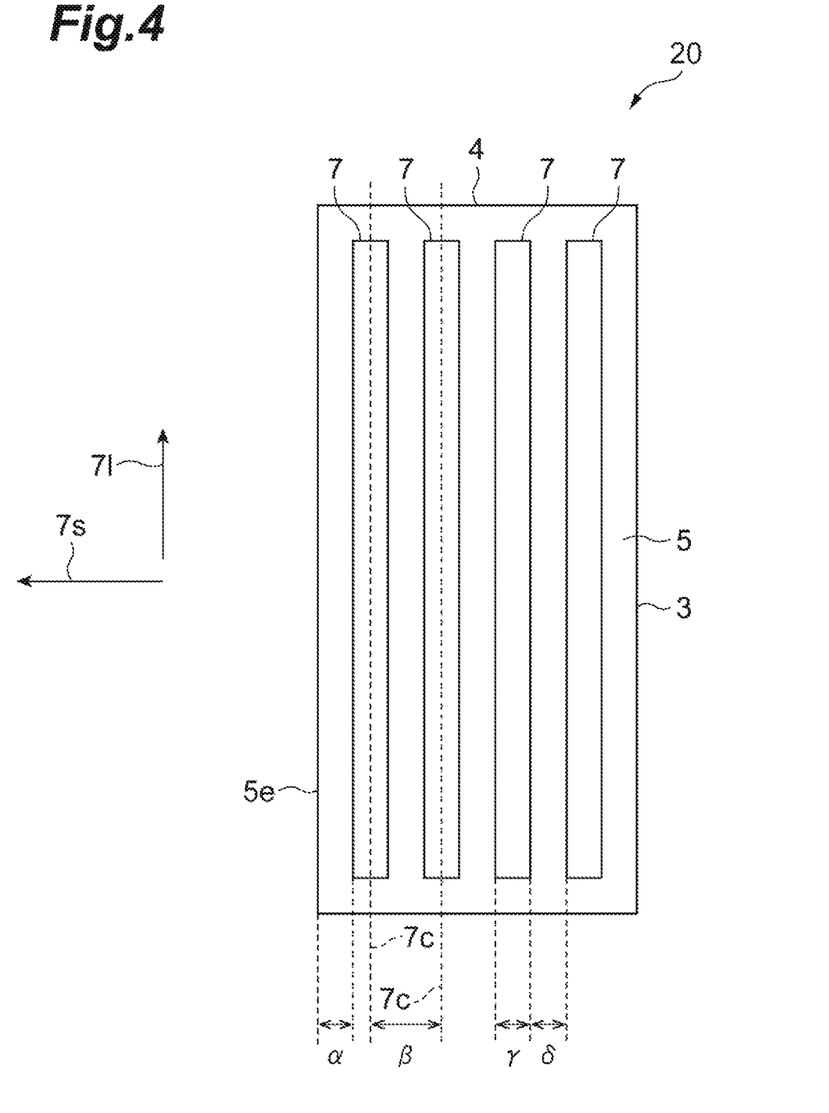
FIG. 4 is a plan view of a conventional die for EFG-based single crystal growth.
Figure 6:
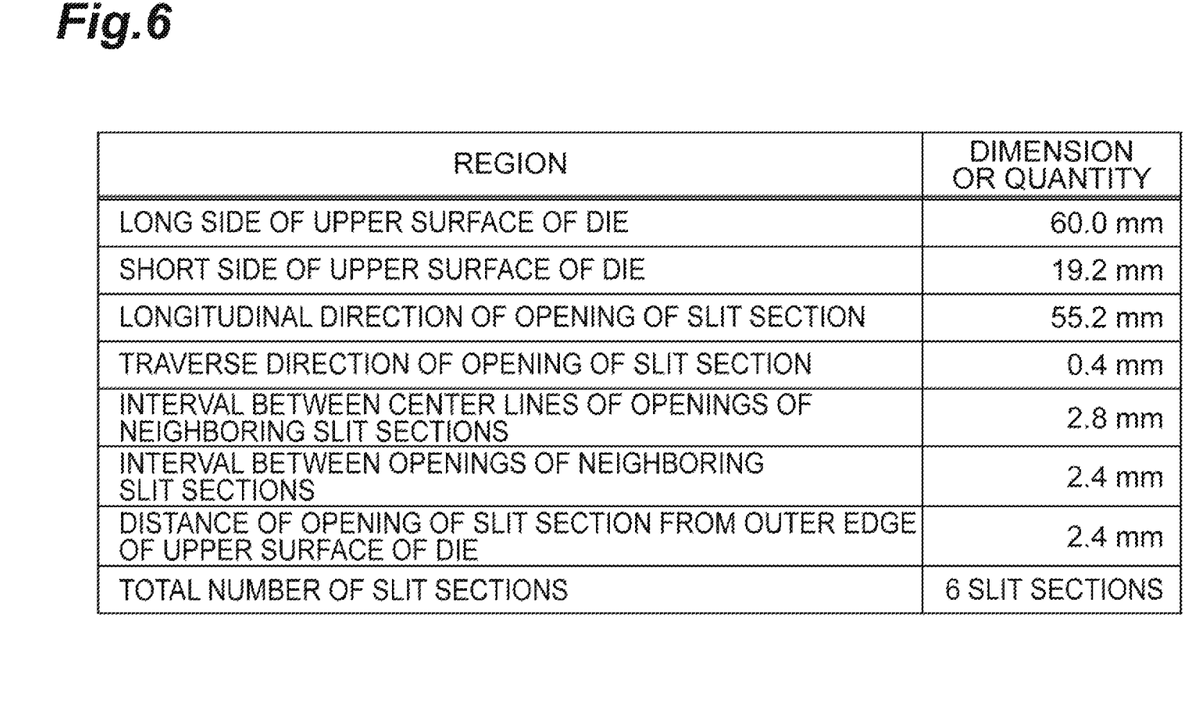
FIG. 6 is a table illustrating specifications of a die for EFG-based single crystal growth according to a comparative example.

A plan view of a die 20 for single crystal growth used as a comparative example is shown in FIG. 4. In the die 20, the respective longitudinal directions 71 of the openings 7 of the plurality of slit sections 6 on the upper surface 5 are parallel to the long side 3 of the upper surface 5. The interval β and the interval δ are equal among the openings 7 of the slit sections 6. Dimensions or quantities of the respective regions of the die 20 are as shown in FIG. 6. The single crystal 14 was grown under completely the same conditions as the conditions in the example except for the die 20 for single crystal growth and 36 single crystal substrates were finally manufactured after being polished to have a thickness of 0.4 mm from one single crystal.

Figure 8:
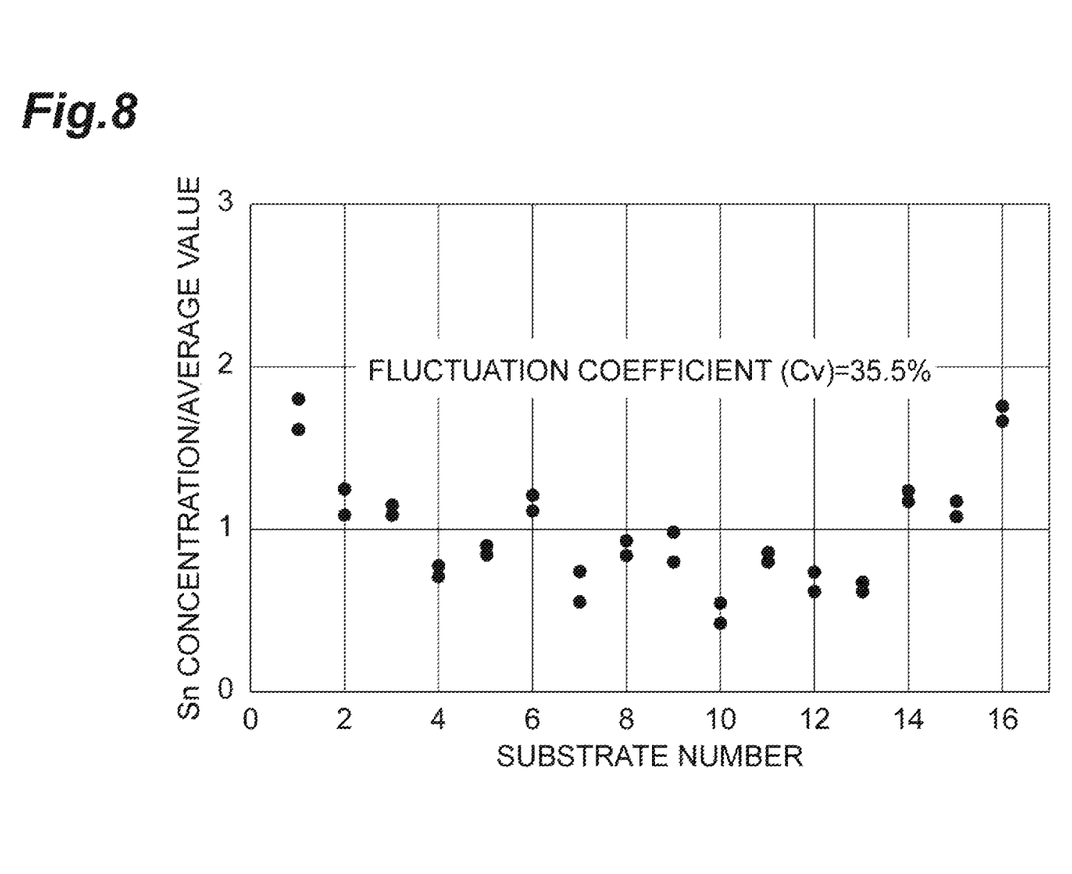
FIG. 8 is a graph illustrating an impurity concentration of an EFG-based single crystal according to the comparative example.

Sn concentrations of 32 single crystal substrates obtained by excluding 4 single crystal substrates located on an outermost side of the single crystal 14 during single crystal growth and having low crystallinity from the 36 single crystal substrates obtained were measured using SIMS. That is, concentrations of Sn, which was an impurity, in the region obtained by excluding a distance range of 1 mm from the outer edge of a cross section orthogonal to the growth direction D of the single crystal 14 were measured. The measurement results are shown in FIG. 8. The abscissa of a graph in FIG. 8 represents order of the single crystal substrates in the thickness direction obtained by cutting the $Ga_2O_3$-based single crystal 14 grown into a thick plate shape in parallel with the main surface of the crystal. The ordinate of the graph in FIG. 8 represents a value obtained by dividing the respective measured values of Sn concentrations of the 32 single crystal substrates by an average value of Sn concentrations of the 32 substrates. A fluctuation coefficient (Cv) of the 32 single crystal substrates, that is, a value obtained by dividing a standard deviation of Sn concentrations by the average value was 35.5%, which exceeds 30%. That is, it is seen that the impurity concentration of the single crystal 14 grown by the die 20 in the comparative example exhibits a low level of uniformity.

From a point in time at which growth of the above single crystal 14 was repeated 6 times, a distortion was observed in a middle part on the upper surface 5 of the die 20 for single crystal growth, and from the ninth growth onward, the amount of the $Ga_2O_3$-based raw material melt 12 supplied from the center of the slit sections 6 decreased in the openings 7 of the slit sections 6 located outside and the $Ga_2O_3$-based raw material melt 12 no longer became wet or spread over the entire upper surface 5 of the die 20. That is, it is seen that the conventional die 20 for single crystal growth is easily deformed and is inferior in durability to the die 1 in the example.

INDUSTRIAL APPLICABILITY

According to the die for EFG-based single crystal growth, the EFG-based single crystal growth method and the EFG-based single crystal of the present invention, it is possible to improve impurity concentration uniformity of a grown single crystal.

REFERENCE SIGNS LIST

1 ... die, 2 ... lower surface, 3 ... long side, 4 ... short side, 5 ... upper surface, 5e ... outer edge, 6 ... slit section, 7 ... opening, 71 ... longitudinal direction, 7s ... traverse direction, 7c ... center line, 10 ... single crystal manufacturing apparatus, 11 ... crucible, 12 ... raw material melt, 13 ... lid, 14 ... single crystal, 15 ... seed crystal, 16 ... seed crystal holder, 17 ... shaft, 20 ... die, D ... growth direction, α ... distance, β ... interval, γ ... length, δ ... interval

The invention claimed is:

1. A die for EFG-based single crystal growth comprising:
   a lower surface configured to be immersed into a raw material melt with an impurity added;
   a rectangular upper surface configured to face a seed crystal and having a long side and a short side shorter than the long side;
   a plurality of slit sections extending from the lower surface to the upper surface and configured to cause the raw material melt to ascend from the lower surface to the upper surface;
   a first plate member that (1) includes a side face of the die and (2) is parallel to the long side; and
   plate members forming the plurality of slit sections, wherein
   longitudinal directions of openings of the plurality of slit sections on the upper surface are parallel to one another and non-parallel to the long side of the upper surface, and
   the first plate member is supported at ends of the first plate member and by the plate members.

2. The die for EFG-based single crystal growth according to claim 1, wherein the longitudinal directions of the openings of the plurality of slit sections on the upper surface are parallel to the short side of the upper surface.

3. The die for EFG-based single crystal growth according to claim 1, wherein a distance of the opening of the slit section on the upper surface that is most proximate to an outer edge of the upper surface from the outer edge of is 2 mm or less.

4. The die for EFG-based single crystal growth according to claim 1, wherein an interval between center lines in the longitudinal direction of the openings of the neighboring slit sections on the upper surface is 2 mm or less.

5. The die for EFG-based single crystal growth according to claim 1, wherein respective lengths in a traverse direction of the openings of the plurality of slit sections on the upper surface is 2 mm or less.

6. An EFG-based single crystal growth method using the die for EFG-based single crystal growth according to claim 1.

7. An EFG-based single crystal grown using the EFG-based single crystal growth method according to claim 6, wherein an impurity concentration fluctuation coefficient is 30% or less in a region excluding a distance range of 1 mm from an outer edge of a cross section orthogonal to a growth direction of the single crystal.

\* \* \* \* \*